US010174165B2

(12) United States Patent
Inoue et al.

(10) Patent No.: US 10,174,165 B2
(45) Date of Patent: Jan. 8, 2019

(54) POLY(AMIC ACID) COMPOSITION AND POLYIMIDE COMPOSITION

(71) Applicant: JFE CHEMICAL CORPORATION, Tokyo (JP)

(72) Inventors: Youhei Inoue, Chiba (JP); Hiroaki Mori, Chiba (JP)

(73) Assignee: JFE CHEMICAL CORPORATION, Tokyo (JP)

( * ) Notice: Subject to any disclaimer, the term of this patent is extended or adjusted under 35 U.S.C. 154(b) by 40 days.

(21) Appl. No.: 15/306,129

(22) PCT Filed: Apr. 20, 2015

(86) PCT No.: PCT/JP2015/002146
§ 371 (c)(1),
(2) Date: Oct. 24, 2016

(87) PCT Pub. No.: WO2015/162901
PCT Pub. Date: Oct. 29, 2015

(65) Prior Publication Data
US 2017/0044321 A1    Feb. 16, 2017

(30) Foreign Application Priority Data
Apr. 24, 2014 (JP) .................. 2014-090616

(51) Int. Cl.
| C08G 73/00 | (2006.01) |
| C08G 73/10 | (2006.01) |
| B32B 15/08 | (2006.01) |
| B32B 15/20 | (2006.01) |
| B32B 27/28 | (2006.01) |
| C08L 79/08 | (2006.01) |
| H05K 1/03  | (2006.01) |
| C09J 7/22  | (2018.01) |
| C09J 7/30  | (2018.01) |
| C09J 7/25  | (2018.01) |

(52) U.S. Cl.
CPC .............. *C08G 73/10* (2013.01); *B32B 15/08* (2013.01); *B32B 15/20* (2013.01); *B32B 27/281* (2013.01); *C08G 73/1042* (2013.01); *C08G 73/1085* (2013.01); *C08L 79/08* (2013.01); *C09J 7/22* (2018.01); *C09J 7/25* (2018.01); *C09J 7/30* (2018.01); *H05K 1/0346* (2013.01); *B32B 2307/206* (2013.01); *B32B 2307/734* (2013.01); *B32B 2457/08* (2013.01); *C09J 2203/326* (2013.01); *C09J 2477/00* (2013.01); *C09J 2479/086* (2013.01); *H05K 2201/0154* (2013.01)

(58) Field of Classification Search
None
See application file for complete search history.

(56) References Cited

U.S. PATENT DOCUMENTS

| 4,734,482 A | 3/1988 | Tamai et al. |
| 5,916,688 A | 6/1999 | Tokuhisa et al. |
| 2007/0009751 A1 | 1/2007 | Hwang et al. |
| 2015/0045481 A1 | 2/2015 | Kim et al. |

FOREIGN PATENT DOCUMENTS

| JP | S60-42817 A   | 3/1985 |
| JP | S62-50374 A   | 3/1987 |
| JP | H05-310917 A  | 11/1993 |
| JP | 08302572 A  * | 11/1996 |
| JP | H08-302572 A  | 11/1996 |
| JP | H10-231424 A  | 9/1998 |
| JP | 36-10999 B2   | 1/2005 |
| JP | 3687044 B2    | 8/2005 |
| JP | 2006-071783 A | 3/2006 |
| JP | 2007-106891 A | 4/2007 |
| KR | 20130103023 A | 9/2013 |

OTHER PUBLICATIONS

Dec. 18, 2017 Office Action issued in Chinese Patent Application No. 201580021382.9.
Jun. 20, 2018 Notice of Allowance issued in Korean Patent Application No. 10-2016-7029452.
March 13, 2018 Office Action issued in Korean Patent Application No. 2016-7029452.
Aug. 14, 2018 Office Action issued in Chinese Patent Application No. 201580021382.9.
Jul. 7, 2015 International Search Report isued in International Application No. PCT/JP2015/002146.
Feb. 23, 2017 Search Report issued in European Patent Application No. 15783685.9.
Oct. 6, 2017 Office Action issued in Korean Patent Application No. 2016-7029452.

* cited by examiner

*Primary Examiner* — Ana L. Woodward
(74) *Attorney, Agent, or Firm* — Oliff PLC

(57) ABSTRACT

There is provided a polyimide composition that is useful for electronic substrate materials, retains high heat resistance and mechanical strength intrinsic to polyimides, and has a lower dielectric constant and dielectric loss tangent. A polyimide composition for use in electronic substrate materials, containing a polyimide produced by polymerization between a diamine component containing 5-(4-aminophenoxy)-3-[4-(4-aminophenoxy)phenyl]-1,1,3-trimethylindan and an acid component containing 3,3',4,4'-biphenyltetracarboxylic acid dianhydride.

8 Claims, No Drawings

POLY(AMIC ACID) COMPOSITION AND POLYIMIDE COMPOSITION

TECHNICAL FIELD

The present disclosure relates to a poly(amic acid) composition and a polyimide composition. More particularly, the present disclosure relates to a poly(amic acid) composition and a polyimide composition that are useful for electronic substrate materials, particularly for high-frequency substrate materials.

BACKGROUND ART

Aromatic polyimides can be produced by condensation polymerization between aromatic diamine compounds and aromatic tetracarboxylic acid compounds followed by curing (imidization). Because of their high mechanical strength, heat resistance, electrical insulating properties, and chemical resistance, various aromatic polyimides are used for electronic substrate materials. With a recent increase in frequency in electronic equipment associated with high-speed signal transmission, there has been a growing demand for polyimides having lower dielectric constants and lower dielectric loss tangents as electronic substrate materials. In electronic circuits, the signal transmission speed decreases with the increasing dielectric constant of substrate materials, and the signal transmission loss increases with increasing dielectric constant and dielectric loss tangent. Thus, lower dielectric constants and dielectric loss tangents of polyimides used as substrate materials are essential for higher performance of electronic equipment. Particularly in communication equipment used at high frequencies, there is a demand for lower dielectric loss tangents.

Examples of polyimides currently used as electronic substrate materials include two-component polyimides, such as p-phenylenediamine (PDA)-3,3',4,4'-biphenyltetracarboxylic acid dianhydride (sBPDA) polyimides (Patent Literature 1), 4,4'-diaminodiphenyl ether (ODA)-pyromellitic acid dianhydride (PMDA) polyimides (Patent Literature 2), and three- and four-component polyimides produced by copolymerization of these monomers at any ratio (Patent Literature 3). These polyimides have relatively high dielectric constants and dielectric loss tangents due to their polar imide groups.

In order to decrease the relatively high dielectric constants and dielectric loss tangents of these polyimides due to polar imide groups, for example, in a method proposed in Patent Literature 4, the dielectric constant of a polyimide is lowered by introducing a monomer having a long-chain skeleton to decrease the number of imide groups per unit molecular length (the concentration of imide groups) and thereby lower the polarity of the entire molecule. Also in a method proposed in Patent Literature 5, the dielectric constant of a polyimide is lowered by introducing fluorine and an aliphatic ring structure. However, in the former method, many aliphatic chain structures in a polyimide impair the intrinsic characteristics of the polyimide, such as mechanical strength, heat resistance, chemical resistance, and insulating properties. In the latter method, introduction of fluorine causes corrosion and damage due to elimination of fluorine during a heating step, and introduction of an aliphatic ring structure disadvantageously lowers heat resistance compared with aromatic ring structures.

Patent Literature 6 discloses a heat-resistant adhesive that contains a polymer (poly(amic acid)) produced by condensation polymerization between 5-(4-aminophenoxy)-3-[4-(4-aminophenoxy)phenyl]-1,1,3-trimethylindan and 3,3',4,4'-biphenyltetracarboxylic acid dianhydride. However, Patent Literature 6 does not describe the dielectric constant and dielectric loss tangent of a polyimide produced by imidization of the poly(amic acid) and does not inform whether the polyimide is useful for electronic substrate materials, particularly for high-frequency substrate materials.

CITATION LIST

Patent Literature

PTL 1: Japanese Examined Patent Application Publication No. 60-42817
PTL 2: Japanese Examined Patent Application Publication No. 36-10999
PTL 3: Japanese Patent No. 3687044
PTL 4: Japanese Unexamined Patent Application Publication No. 2007-106691
PTL 5: Japanese Unexamined Patent Application Publication No. 2006-71783
PTL 6: Japanese Unexamined Patent Application Publication No. 62-50374

SUMMARY

Technical Problem

Accordingly, it is an object of the present disclosure to provide a polyimide composition that is useful for electronic substrate materials, retains high heat resistance and mechanical strength intrinsic to polyimides, and has a lower dielectric constant and dielectric loss tangent.

Solution to Problem

The present inventors have made extensive studies to solve these problems and have found that a polyimide composition produced from a diamine component containing 5-(4-aminophenoxy)-3-[4-(4-aminophenoxy)phenyl]-1,1,3-trimethylindan, which has both an aromatic ring and an aliphatic ring in its molecular structure irrespective of its long-chain molecule, and an acid component containing 3,3',4,4'-biphenyltetracarboxylic acid dianhydride, which has a rigid linear molecular structure, retains high heat resistance and mechanical strength intrinsic to polyimides and has a lower dielectric constant and dielectric loss tangent, and is useful for electronic substrate materials, particularly for high-frequency substrate materials.

The disclosed exemplary embodiments provide the following (1) to (9).

(1) A poly(amic acid) composition for use in electronic substrate materials, containing a poly(amic acid) produced by polymerization between a diamine component containing 5-(4-aminophenoxy)-3-[4-(4-aminophenoxy)phenyl]-1,1,3-trimethylindan and an acid component containing 3,3',4,4'-biphenyltetracarboxylic acid dianhydride.

(2) A polyimide composition for use in electronic substrate materials, containing a polyimide produced by condensation polymerization between a diamine component containing 5-(4-aminophenoxy)-3-[4-(4-aminophenoxy)phenyl]-1,1,3-trimethylindan and an acid component containing 3,3',4,4'-biphenyltetracarboxylic acid dianhydride.

(3) A polyimide composition for use in electronic substrate materials, produced by curing the poly(amic acid) composition according to (1).

(4) The polyimide composition according to (2) or (3), wherein the polyimide composition has a relative dielectric constant of 3.0 or less at a frequency of 1 GHz.

(5) The polyimide composition according to any one of (2) to (4), wherein the polyimide composition has a dielectric loss tangent of 0.005 or less at a frequency of 1 GHz.

(6) The polyimide composition according to (4) or (5), wherein the polyimide composition is usable for a high-frequency substrate material.

(7) An electric substrate including a film formed of the polyimide composition according to any one of (2) to (6).

(8) An electric substrate including a film formed of the polyimide composition according to any one of (4) to (6).

(9) A coverlay film including an adhesive layer on a polyimide film, wherein the polyimide film is formed of the polyimide composition according to any one of (2) to (6), and the adhesive layer contains the poly(amic acid) composition according to (1).

Advantageous Effects

The present disclosure can provide a polyimide composition that is useful for electronic substrate materials, retains high heat resistance and mechanical strength intrinsic to polyimides, and has a lower dielectric constant and dielectric loss tangent.

A poly(amic acid) composition according to the present disclosure and a polyimide composition according to the present disclosure have high heat resistance and mechanical strength and a low dielectric constant and dielectric loss tangent, and are useful for electronic substrate materials, particularly for high-frequency substrate materials.

DESCRIPTION OF EMBODIMENTS

A poly(amic acid) composition and a polyimide composition according to the disclosed embodiments will be described in detail below.

[Poly(amic acid) Composition]

A poly(amic acid) composition according to the present disclosure contains a poly(amic acid) produced by polymerization between a diamine component containing 5-(4-aminophenoxy)-3-[4-(4-aminophenoxy)phenyl]-1,1,3-trimethylindan and an acid component containing 3,3',4,4'-biphenyltetracarboxylic acid dianhydride and is used for electronic substrate materials.

5-(4-aminophenoxy)-3-[4-(4-aminophenoxy)phenyl]-1,1,3-trimethylindan is a long-chain molecule having both an aromatic ring structure and an aliphatic ring structure, and can therefore maintain high heat resistance and mechanical strength intrinsic to polyimides and lower the dielectric constant and dielectric loss tangent of polyimides. 3,3',4,4'-biphenyltetracarboxylic acid dianhydride has a rigid linear molecular structure and can therefore impart high heat resistance and mechanical strength to polyimides. A polyimide produced from a diamine component containing 5-(4-aminophenoxy)-3-[4-(4-aminophenoxy)phenyl]-1,1,3-trimethylindan and an acid component containing 3,3',4,4'-biphenyltetracarboxylic acid dianhydride can have high heat resistance and mechanical characteristics and a lower dielectric constant and dielectric loss tangent.

In a poly(amic acid) composition according to the disclosed embodiments, the diamine component may contain another diamine compound in addition to 5-(4-aminophenoxy)-3-[4-(4-aminophenoxy)phenyl]-1,1,3-trimethylindan.

Examples of diamine compounds other than 5-(4-aminophenoxy)-3-[4-(4-aminophenoxy)phenyl]-1,1,3-trimethylindan include aromatic diamines, such as 4,4'-diaminodiphenyl ether (hereinafter also referred to as "ODA"), 1,4-phenylenediamine (p-phenylenediamine, hereinafter also referred to as "PDA"), and 2,2-bis[4-(4-aminophenoxy)phenyl]propane (hereinafter also referred to as "BAPP"); linear aliphatic diamines, such as 1,2-diaminoethane, 1,3-diaminopropane, 1,4-diaminobutane, 1,5-diaminopentane, 1,6-hexanediamine, 1,7-heptanediamine, 1,8-octanediamine, 1,9-nonanediamine, 1,10-decanediamine, 1,11-undecanediamine, and 1,12-dodecanediamine; branched aliphatic diamines, such as 1,2-diaminopropane, 1,2-diamino-2-methylpropane, 1,3-diamino-2-methylpropane, 1,3-diamino-2,2-dimethylpropane, 1,3-diaminopentane, and 1,5-diamino-2-methylpentane; and alicyclic diamines, such as 5-amino-1,3,3-trimethylcyclohexanemethylamine (isophorone diamine), 1,4-diaminocyclohexane, 1,3-diaminocyclohexane, 1,4-cyclohexanebis(methylamine), 1,3-cyclohexanebis(methylamine), 4,4'-diaminodicyclohexylmethane, bis(4-amino-3-methylcyclohexyl)methane, 3(4),8(9)-bis(aminomethyl)tricyclo[5.2.1.0$^{2,6}$]decane, 2,5(6)-bis(aminomethyl)bicyclo[2.2.1]heptane, 1,3-diaminoadamantane, 3,3'-diamino-1,1'-biadamantyl, and 1,6-diaminoadamantane. Diamine compounds other than 5-(4-aminophenoxy)-3-[4-(4-aminophenoxy)phenyl]-1,1,3-trimethylindan may be used alone or in combination.

The 5-(4-aminophenoxy)-3-[4-(4-aminophenoxy)phenyl]-1,1,3-trimethylindan content of the diamine component is preferably 10% or more by mole, more preferably 50% or more by mole, in order to maintain high heat resistance and mechanical strength of the polyimide composition and lower the dielectric constant and dielectric loss tangent of the polyimide composition.

In a poly(amic acid) composition according to the disclosed embodiments, the acid component may contain another polycarboxylic anhydride in addition to 3,3',4,4'-biphenyltetracarboxylic acid dianhydride.

Examples of polycarboxylic anhydrides other than 3,3',4,4'-biphenyltetracarboxylic acid dianhydride include aromatic tetracarboxylic acid dianhydrides, such as pyromellitic acid dianhydride (PMDA), 4,4'-oxydiphthalic acid anhydride (ODPA), 3,3',4,4'-benzophenonetetracarboxylic acid dianhydride (BTDA), 3,3',4,4'-diphenylsulfone tetracarboxylic acid dianhydride (DSDA), and 2,2-bis[4-(3,4-dicarboxyphenoxy)phenyl]propane dianhydride (EPADA). Polycarboxylic anhydrides other than 3,3',4,4'-biphenyltetracarboxylic acid dianhydride may be used alone or in combination.

The 3,3',4,4'-biphenyltetracarboxylic acid dianhydride content of the acid component is preferably 50% or more by mole, more preferably 80% or more by mole, in order to improve the mechanical strength and heat resistance of the polyimide composition.

With respect to the amounts of diamine component and acid component, in order to sufficiently increase the molecular weight of the polymer, the number of equivalents of the acid anhydride group of the acid component is preferably 0.9 or more per equivalent of the amino group of the diamine component.

A poly(amic acid) composition according to the disclosed embodiments may further contain a solvent. Examples of the solvent include N,N-dimethylacetamide, N-methyl-2-pyrrolidone, dimethyl sulfoxide, N,N-diethylacetamide, N,N-dimethylformamide, N,N-diethylformamide, and dimethyl suit one. Any solvent that can dissolve the components may be used. These solvents may be used alone or in combination.

A method for producing a poly(amic acid) composition according to the disclosed embodiments includes a process of polymerization between a diamine component containing 5-(4-aminophenoxy)-3-[4-(4-aminophenoxy)phenyl]-1,1,3-trimethylindan and an acid component containing 3,3',4,4'-biphenyltetracarboxylic acid dianhydride.

In polymerization between a diamine component and an acid component, for example, nearly equimolar amounts of the diamine component and the acid component are added to a solvent, and the diamine component and the acid component are polymerized in the solvent. In addition to the diamine component and the acid component, an additive agent described later may be added to the solvent.

A diamine component and an acid component may be polymerized under any conditions. For example, a mixture of a diamine component and an acid component in N,N-dimethylacetamide (solvent) are stirred and allowed to react at a temperature of 80° C. or less in the air or in a nitrogen atmosphere, thus producing a poly(amic acid) solution (a poly(amic acid) composition).

In a poly(amic acid) composition produced by the production method, a poly(amic acid) in a solvent preferably constitutes 10% to 30% by mass (concentration) of the poly(amic acid) composition.

A poly(amic acid) composition according to the disclosed embodiments can be used as a varnish for electronic substrate materials, particularly for high-frequency substrate materials.

A poly(amic acid) in a poly(amic acid) composition according to the disclosed embodiments (a poly(amic acid) according to the disclosed embodiments) has a repeating unit represented by the following formula (I).

[Chem. 1]

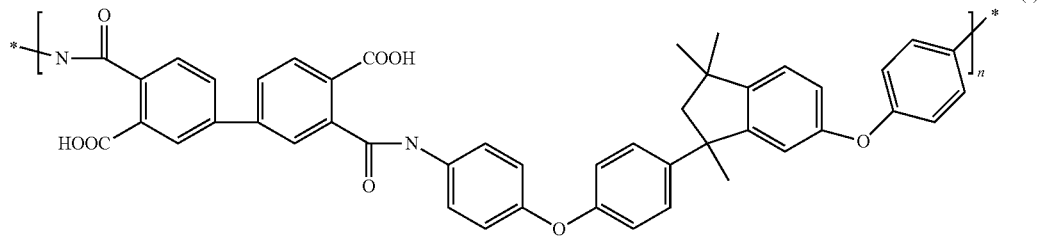

A poly(amic acid) according to the disclosed embodiments may have any molecular structure. For example, a poly(amic acid) according to the disclosed embodiments may be a random copolymer, an alternating copolymer, or a block copolymer.

A poly(amic acid) composition according to the disclosed embodiments may contain a poly(amic acid) or two or more poly(amic acid)s.

A poly(amic acid) composition according to the disclosed embodiments may further contain an additive agent. The additive agent may be a dehydrating agent and/or a catalyst for converting a poly(amic acid) into a polyimide by cyclodehydration (imidization).

The dehydrating agent may be an aliphatic carboxylic anhydride, such as acetic anhydride, or an aromatic carboxylic anhydride, such as phthalic acid anhydride. These dehydrating agents may be used alone or in combination.

The catalyst may be a heterocyclic tertiary amine, such as pyridine, picoline, or quinoline; an aliphatic tertiary amine, such as triethylamine; or an aromatic tertiary amine, such as N,N-dimethylaniline. These catalysts may be used alone or in combination.

A poly(amic acid) composition according to the present disclosure is useful as a precursor of a polyimide composition for electronic substrate materials, particularly for high-frequency substrate materials.

A poly(amic acid) composition according to the present disclosure is also useful as a material of an adhesive layer of a coverlay film for use in flexible printed circuit boards (FPC boards). An adhesive layer of a coverlay film may be formed by applying a poly(amic acid) composition to a polyimide film and removing a solvent to form a film.

A poly(amic acid) composition according to the present disclosure can be cured to produce a polyimide composition described below.

[Polyimide Composition]

A polyimide composition according to the disclosed embodiments contains a polyimide produced by polymerization between a diamine component containing 5-(4-aminophenoxy)-3-[4-(4-aminophenoxy)phenyl]-1,1,3-trimethylindan and an acid component containing 3,3',4,4'-biphenyltetracarboxylic acid dianhydride and is used for electronic substrate materials.

The diamine component and the acid component are the same as described above for a poly(amic acid) composition according to the present disclosure.

A method for producing a polyimide composition according to the disclosed embodiments includes a process of polymerization between a diamine component containing 5-(4-aminophenoxy)-3-[4-(4-aminophenoxy)phenyl]-1,1,3-trimethylindan and an acid component containing 3,3',4,4'-biphenyltetracarboxylic acid dianhydride.

In polymerization between a diamine component and an acid component, for example, nearly equimolar amounts of the diamine component and the acid component are added to a solvent, and the diamine component and the acid component are polymerized in the solvent. In addition to the diamine component and the acid component, the additive agent described above may be added to the solvent.

A polyimide composition according to the disclosed embodiments may be produced by direct polymerization between a diamine component and an acid component in a solvent or by cyclodehydration (imidization) of a poly(amic acid) composition aor a poly(amic acid).

A method for converting a poly(amic acid) into a polyimide by cyclodehydration may be a chemical cyclization method involving dehydration with a dehydrating agent and a catalyst or a thermal cyclization method involving thermal dehydration. These methods may be used alone or in combination. The dehydrating agent and catalyst used in the chemical cyclization method are the same as described above.

In the thermal cyclization method, the heating temperature generally ranges from 100° C. to 400° C., preferably 200° C. to 350° C., more preferably 250° C. to 300° C. The heating time generally ranges from 1 minute to 6 hours, preferably 5 minutes to 2 hours, more preferably 15 minutes to 1 hour. The heating atmosphere is preferably, but is not limited to, an inert atmosphere, such as a nitrogen gas atmosphere or a nitrogen/hydrogen mixed gas atmosphere, in order to prevent coloring of the surface of the cured polyimide.

More specifically, for example, a film of a polyimide composition (polyimide) can be produced by heating a film of a poly(amic acid) composition to a high temperature. The thermal cyclization method may be combined with the chemical cyclization method.

In the formation of a film of a polyimide composition (polyimide) from a poly(amic acid) composition, solvent removal and heating for imidization may be successively performed, or solvent removal and imidization may be simultaneously performed.

A polyimide composition (polyimide) can be dissolved in a solvent to produce a polyimide solution (varnish). A poly(amic acid) solution can be converted into a polyimide solution by direct heating or by dehydration and imidization in the presence of a catalyst.

A polyimide solution can be added dropwise in a poor solvent, such as water or methanol, and filtered to produce a polyimide powder.

The polyimide solution (varnish) can be casted and dried on the substrate to form a polyimide film. A polyimide powder can be heated and compressed into a polyimide formed product.

A polyimide in a polyimide composition according to the disclosed embodiments (a polyimide according to the disclosed embodiments) has a repeating unit represented by the following formula (II).

is 100 MPa or more. The tensile modulus and tensile strength are measured according to JIS K 7127:1999 (ISO 527-3:1995).

With respect to the heat resistance of a polyimide composition according to the present disclosure, the glass transition temperature is preferably 220° C. or more. The glass transition temperature is measured according to JIS K 7244-1:1998 (ISO 6721-1:1994).

With respect to the dielectric properties of a polyimide composition according to the present disclosure, the relative dielectric constant at a frequency of 1 GHz is preferably 3.0 or less, or the dielectric loss tangent at a frequency of 1 GHz is preferably 0.005 or less; more preferably, the relative dielectric constant at a frequency of 1 GHz is 3.0 or less, and the dielectric loss tangent at a frequency of 1 GHz is 0.005 or less. The relative dielectric constant and dielectric loss tangent are measured according to JIS C 2565:1992.

A polyimide composition according to the present disclosure, has high heat resistance and mechanical strength and a low dielectric constant and dielectric loss tangent, and is therefore useful for electronic substrate materials, particularly for high-frequency substrate materials.

[Electric Substrate, High-Frequency Substrate]

A poly(amic acid) composition according to the present disclosure or a polyimide composition according to the present disclosure can be used to produce a polyimide film for electric substrates, particularly for high-frequency substrates (a polyimide film according to the present disclosure).

A polyimide film according to the present disclosure can be produced by any method, for example, by applying a poly(amic acid) composition according to a support (for example, a glass plate, a stainless steel plate, a copper plate, or an aluminum plate) and drying and heating the poly(amic acid) composition for cyclodehydration (imidization), or by dissolving a polyimide according to the present disclosure in an organic solvent, applying the solution to a glass plate, and removing the solvent. A poly(amic acid) composition

[Chem. 2]

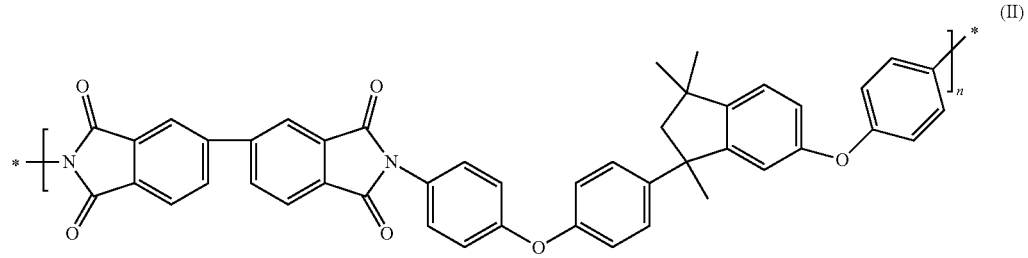

A polyimide according to the disclosed embodiments may have any molecular structure. For example, a polyimide according to the disclosed embodiments may be a random copolymer, an alternating copolymer, or a block copolymer.

A polyimide composition according to the disclosed embodiments may contain a polyimide or two or more polyimides.

With respect to the mechanical strength of a polyimide composition according to the present disclosure, the tensile modulus is preferably 1.5 GPa or more, or the tensile strength is preferably 75 MPa or more; more preferably, the tensile modulus is 2.0 GPa or more, and the tensile strength according to the present disclosure may be applied to the support by any method, including a known method.

The organic solvent is preferably an aprotic polar solvent in terms of dissolving ability, for example, N,N-dimethylacetamide, N,N-dimethylformamide, N-methyl-2-pyrrolidone, hexamethylphosphoramide, dimethyl sulfoxide, γ-butyrolactone, 1,3-dimethyl-2-imidazolidinone, cyclohexanone, or cyclopentanone. The organic solvent may be any solvent having dissolving ability. These organic solvents may be used alone or in combination. In this case, the polyimide content preferably ranges from 5% to 50% by mass, more preferably 10% to 30% by mass.

For example, a poly(amic acid) composition applied to a glass plate can be dried at a temperature in the range of 50° C. to 150° C. for a drying time in the range of approximately 0.5 to 80 minutes, and can be heat-treated at a temperature in the range of approximately 100° C. to 400° C., preferably approximately 200° C. to 350° C., more preferably approximately 250° C. to 300° C., to form a polyimide film. In order to prevent coloring of the polyimide film, 400° C. or less is preferred. Furthermore, in order to prevent coloring of the polyimide film, imidization is preferably performed under reduced pressure or in a nitrogen atmosphere, although imidization may be performed in the air as long as the temperature is not high.

When imidization is performed under reduced pressure, a lower pressure is preferred, although the pressure is not particularly limited under the heating conditions described above, provided that water can be removed. More specifically, the pressure ranges from approximately 0.09 to 0.0001 MPa.

In the case of polyimide films formed in this manner, another cross-linking resin and/or thermosetting resin may be used in the production of a polyimide from a poly(amic acid) composition, without losing the advantages of the present disclosure. If necessary, inorganic fiber, such as glass fiber and/or carbon fiber, and/or an additive agent, such as an oxidation stabilizer, an end-capping agent, filler, a silane coupling agent, a photosensitizer, a photopolymerization initiator, and/or a sensitizer may be mixed.

A polyimide film thus formed can be used for electric substrates and high-frequency substrates, for example, by forming an electrically conductive film on the polyimide film and forming an electronic circuit or a high-frequency circuit.

EXAMPLES

Although the present disclosure will be further described in the following examples, the present disclosure is not limited to these examples.

Abbreviations in the following examples and comparative examples are as follows:

INDAN: 5-(4-aminophenoxy)-3-[4-(4-aminophenoxy)phenyl]-1,1,3-trimethylindan

PDA: p-phenylenediamine

BAPP: 2,2-bis[4-(4-aminophenoxy)phenyl]propane

TMDA: 5-amino-1-(4-aminophenyl)-1,3,3-trimethylindan sBPDA: 3,3',4,4'-biphenyltetracarboxylic acid dianhydride BPADA: 2,2-bis[4-(3,4-dicarboxyphenoxy)phenyl]propane dianhydride DMAc: N,N-dimethylacetamide Example 1

60.5 g of INDAN and 39.5 g of sBPDA were added to 400 g of DMAc and were stirred and allowed to react at normal temperature and at atmospheric pressure for 3 hours, thus producing a poly(amic acid) solution. 15 g of the poly(amic acid) solution was applied to a glass plate with a bar coater and was heated at 100° C. for 20 minutes, at 200° C. for 20 minutes, and then at 300° C. for 20 minutes, thus forming a polyimide film having a thickness of approximately 50 μm.

The polyimide film was evaluated by the evaluation method described later. Table 1 shows the results. The mole ratio of each component is based on all the diamine components or all the acid components.

Examples 2 to 4

A poly(amic acid) solution and a polyimide film were prepared in the same manner as in Example 1 except that the components were mixed at a mole ratio listed in Table 1.

The polyimide film was evaluated by the evaluation method described later. Table 1 shows the results.

Comparative Examples 1 to 4

A poly(amic acid) solution and a polyimide film were prepared in the same manner as in Example 1 except that the components were mixed at a mole ratio listed in Table 1.

The polyimide film was evaluated by the evaluation method described later. Table 1 shows the results.

<Evaluation Method>

The polyimide films thus formed were evaluated with respect to their mechanical strength (tensile modulus, tensile strength), heat resistance (glass transition temperature), and dielectric properties (dielectric constant, dielectric loss tangent).

<<Mechanical Strength>>

The tensile modulus and tensile strength were measured under the following conditions according to LTIS K 7127:1999 (ISO 527-3:1995).

Measuring apparatus: AGS-J manufactured by Shimadzu Corporation

Cross head speed: 102 mm/min

Distance between grips: 30 mm

<<Heat Resistance>>

The glass transition temperature was measured under the following conditions according to JIS K 7244-1:1998 (ISO 6721-1:1994).

Instrument: DMA Q800 manufactured by TA Instrument

Heating rate: 3° C./min

Temperature range: 50° C. to 450° C.

Frequency: 1 Hz

<<Dielectric Properties>>

The relative dielectric constant and dielectric loss tangent were measured under the following conditions according to JIS C 2565:1992.

Measuring apparatus: dielectric constant measuring apparatus manufactured by AET Method of measurement: cavity resonator method Measurement frequency: 1 GHz

TABLE 1

| | | | Example 1 | Example 2 | Example 3 | Example 4 | Comparative example 1 | Comparative example 2 | Comparative example 3 | Comparative example 4 | Comparative example 5 |
|---|---|---|---|---|---|---|---|---|---|---|---|
| Mole ratio of components | Amine component | INDAN | 1.0 | 0.5 | 0.1 | 1.0 | — | — | — | 0.05 | — |
| | | BAPP | — | 0.5 | 0.9 | — | — | — | 1.0 | 0.95 | 1.0 |
| | | PDA | — | — | — | — | 1.0 | — | — | — | — |
| | | TMDA | — | — | — | — | — | 1.0 | — | — | — |

TABLE 1-continued

|  |  | Example 1 | Example 2 | Example 3 | Example 4 | Comparative example 1 | Comparative example 2 | Comparative example 3 | Comparative example 4 | Comparative example 5 |
|---|---|---|---|---|---|---|---|---|---|---|
|  | Acid component sBPDA | 1.0 | 1.0 | 1.0 | 0.5 | 1.0 | 1.0 | 1.0 | 1.0 | — |
|  | ODPA | — | — | — | — | — | — | — | — | — |
|  | BPADA | — | — | — | 0.5 | — | — | — | — | 1.0 |
| Mechanical strength | Tensile modulus (GPa) | 2.2 | 2.1 | 2.1 | 2.1 | 5.5 | 3.0 | 2.1 | 2.1 | 2.0 |
|  | Tensile strength (MPa) | 100 | 100 | 100 | 85 | 230 | 150 | 95 | 97 | 70 |
| Heat resistance | Glass transition temperature (° C.) | 275 | 273 | 270 | 245 | >300 | >300 | 265 | 267 | 215 |
| Dielectric properties | Dielectric constant (-) | 2.9 | 3.0 | 3.0 | 3.0 | 3.5 | 3.2 | 3.1 | 3.1 | 3.0 |
|  | Dielectric loss tangent (-) | 0.004 | 0.005 | 0.005 | 0.005 | 0.010 | 0.015 | 0.006 | 0.006 | 0.005 |

Polyimides containing INDAN and sBPDA (Examples 1 to 4) have high mechanical strength, high heat resistance, and good dielectric properties.

In contrast, a typical PDA-sBPDA polyimide without INDAN (Comparative Example 1) and a TMDA-sBPDA polyimide containing an amine monomer having a skeleton similar to INDAN (Comparative Example 2) have high tensile strength, high glass transition temperatures, high mechanical strength, and good thermal properties, but have poor dielectric properties due to high dielectric constants and dielectric loss tangents. BAPP-sBPDA polyimides without INDAN or having an INDAN content of less than 10% by mole (Comparative Examples 3 and 4) have relatively high mechanical strength, but have poor dielectric properties due to relatively high dielectric constants and dielectric loss tangents. A BAPP-BPADA polyimide without INDAN and sBPDA (Comparative Example 5) has good dielectric properties due to a relatively low dielectric constant and dielectric loss tangent, but has low mechanical strength and heat resistance.

INDUSTRIAL APPLICABILITY

Poly(amic acid)s and polyimide compositions according to the present disclosure are suitable for substrate materials of electronic equipment (electronic substrate materials), particularly for substrate materials of electronic equipment used in high-frequency regions (high-frequency substrate materials) and contribute to higher performance of electronic equipment.

The invention claimed is:

1. A polyimide composition for use in electronic substrate materials, produced by curing a poly(amic acid) composition, the poly(amic acid) composition comprising:
    a poly(amic acid) produced by polymerization between a diamine component containing 5-(4-aminophenoxy)-3-[4-(4-aminophenoxy)phenyl]-1,1,3-trimethylindan and an acid component containing 3,3',4,4'-biphenyltetracarboxylic acid dianhydride,
    wherein the diamine component contains 10% or more by mole of the 5-(4-aminophenoxy)-3-[4-(4-aminophenoxy)phenyl]-1,1,3-trimethylindan, and
    the polyimide composition has a relative dielectric constant of 3.0 or less at a frequency of 1 GHz and a dielectric loss tangent of 0.005 or less at a frequency of 1 GHz.

2. An electric substrate comprising a film formed of the polyimide composition according to claim 1.

3. The polyimide composition according to claim 1, wherein the diamine component contains 50% or more by mole of 5-(4-aminophenoxy)-3-[4-(4-aminophenoxy)phenyl]-1,1,3-trimethylindan.

4. A polyimide composition for use in electronic substrate materials, the composition comprising:
    a polyimide produced by condensation polymerization between a diamine component containing 5-(4-aminophenoxy)-3-[4-(4-aminophenoxy)phenyl]-1,1,3-trimethylindan and an acid component containing 3,3',4,4'-biphenyltetracarboxylic acid dianhydride,
    wherein the diamine component contains 10% or more by mole of the 5-(4-aminophenoxy)-3-[4-(4-aminophenoxy)phenyl]-1,1,3-trimethylindan, and
    the polyimide composition has a relative dielectric constant of 3.0 or less at a frequency of 1 GHz and a dielectric loss tangent of 0.005 or less at a frequency of 1 GHz.

5. The polyimide composition according to claim 4, wherein the polyimide composition is usable for a high-frequency substrate material.

6. An electric substrate comprising a film formed of the polyimide composition according to claim 4.

7. A coverlay film comprising the polyimide composition according to claim 4.

8. The polyimide composition according to claim 4, wherein the diamine component contains 50% or more by mole of 5-(4-aminophenoxy)-3-[4-(4-aminophenoxy)phenyl]-1,1,3-trimethylindan.

* * * * *